Figure 1:
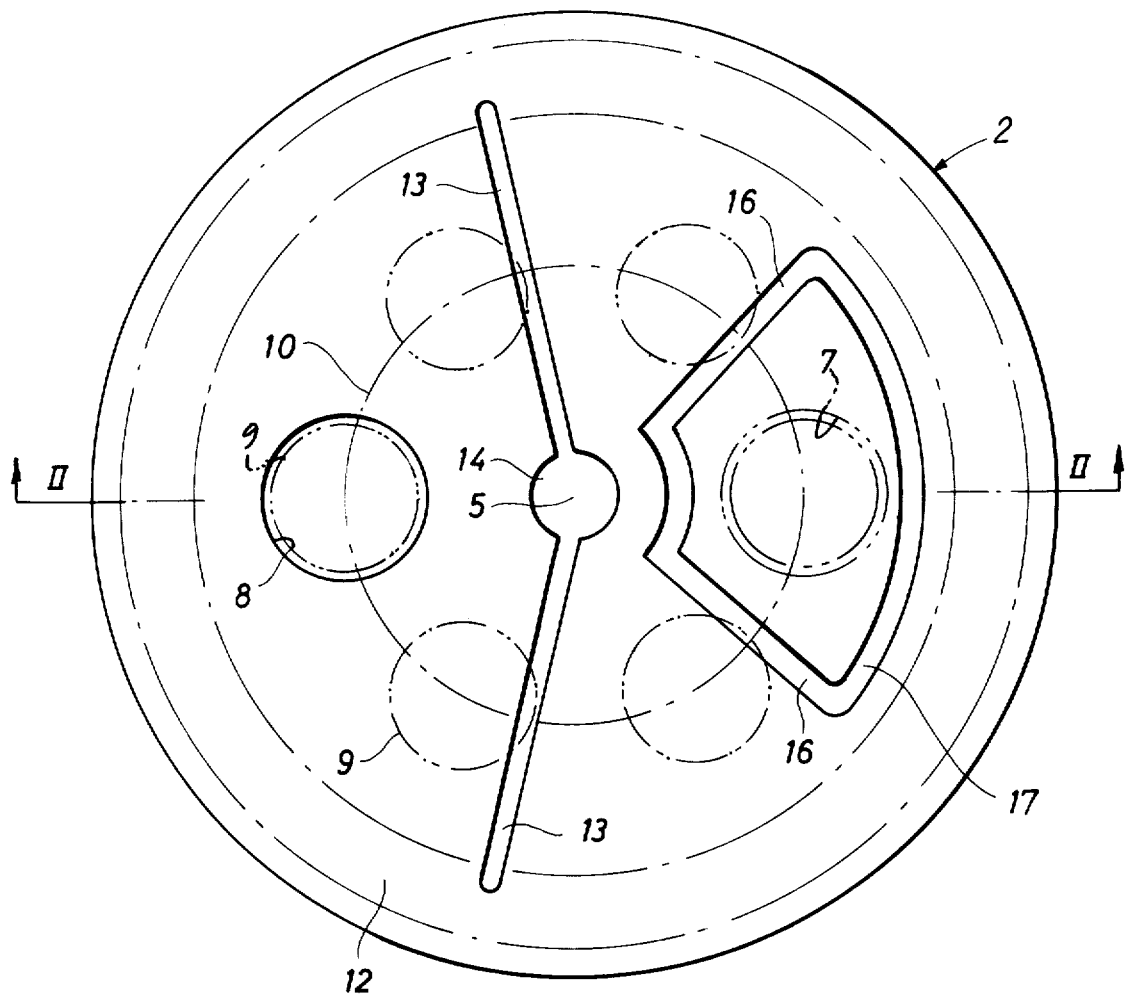

United States Patent [19]

Jespersen et al.

[11] 4,044,266
[45] Aug. 23, 1977

[54] APPARATUS FOR ION-IMPLANTATION IN ELEMENTS, ESPECIALLY DISCS OF SEMI-CONDUCTING MATERIAL

[75] Inventors: Einar Jespersen, Roskilde; Ottar Asbjørn Skilbreid, Lyngby, both of Denmark

[73] Assignee: Danfysik A/S, Denmark

[21] Appl. No.: 701,498

[22] Filed: July 1, 1976

[30] Foreign Application Priority Data

July 9, 1975 Denmark .......................... 3103/75

[51] Int. Cl.$^2$ .................. G01N 21/00; G01N 23/00; G21G 5/00
[52] U.S. Cl. ................................ 250/441; 250/492 A
[58] Field of Search .......................... 250/441, 492 A

[56] References Cited

U.S. PATENT DOCUMENTS

| 3,342,992 | 9/1967 | Schmidt et al. | 250/441 |
| 3,356,844 | 12/1967 | Houbart | 250/441 |
| 3,400,265 | 9/1968 | Houbart | 250/441 |

FOREIGN PATENT DOCUMENTS

| 1,426,865 | 3/1976 | United Kingdom | 250/441 |

Primary Examiner—Alfred E. Smith
Assistant Examiner—T. N. Grigsby

Attorney, Agent, or Firm—Hill, Gross, Simpson, Van Santen, Steadman, Chiara & Simpson

[57] ABSTRACT

An apparatus for ion-implantation in elements, especially discs of semi-conducting material, in which a vacuum container has an end wall which has lock means by which the elements may be passed from the outside of the container to a position in the end wall, where one of its surfaces is exposed to the vacuum space in the container and treated by ions. The lock means includes a rotatable slide valve mounted between two parallel walls in one of which an aperture to the outer atmosphere is provided and in the second of which an aperture to the inner space of the container is provided. A number of apertures, corresponding to the said apertures in the walls, are provided in the slide value. The elements are positioned in one of the apertures in the slide valve, and by its rotation, conveyed to the wall aperture opening into the vacuum space. In the two parallel walls, two sets of cavities are provided, one encircling the other, each of which is connected to a separate vacuum source. When an element is conveyed from the wall aperture connected with the atmosphere to the wall aperture connected with the vacuum space, it passes the two systems of cavities, so that air in all value apertures of the lock means will be successively evacuated to the vacuum sources.

5 Claims, 2 Drawing Figures

U.S. Patent  Aug. 23, 1977  4,044,266

APPARATUS FOR ION-IMPLANTATION IN ELEMENTS, ESPECIALLY DISCS OF SEMI-CONDUCTING MATERIAL

BACKGROUND OF THE INVENTION

1. Field of the Invention

This invention relates to an apparatus for ion-implantation in elements, the apparatus including a novel lock or transfer means for inserting and removing the elements from a high vacuum space.

2. Prior Art

In the manufacture of semi-conducting components, such as transistors, there is used a semi-conducting material, such as silicon, which is activated. The activation consists in introducing small amounts of another substance, e.g. boron. This additive is to "dope" the elements to a certain depth under the surface, and the depth depends on the purpose and the use of the components which are to be manufactured from the element.

The doping has previously been carried out by the so-called diffusion method. During recent years the so-called ion-implantation method has been used which opens up the possibility of manufacturing new types of components and a substantially greater homogeneity of the finished products.

For the implantation method, an apparatus may be used, having a lock means arranged in one end of a vacuum space, and an ion-source and ion-acceleration means are arranged in the other end. In the ion-source, the dope-material is ionized. The ions are accelerated to the necessary speed and are fired on the element which is situated in the lock means, a surface of the element being exposed toward the inner space of the vacuum container.

In the use of such method, it has been difficult to maintain the high vacuum which is necessary for obtaining a satisfactory result, due to the fact that air leaks into the vacuum space from the outer atmosphere through the lock means.

Apparatus is known which uses a circular disc having a plurality of apertures arranged in a ring, an element which is to be treated being arranged in each of said apertures. Thereafter the lock means is airtightly closed and evacuated, so that all the cavities in the lock means have substantially the same pressure as the vacuum container. When all the elements have been treated, the lock means is opened and the elements are removed.

In order to increase the working speed and the capacity of the apparatus it is desirable that the elements be introduced and removed continuously without stopping the process for replacing a treated set by a new set and evacuating the lock means. However, in such a continuous process lines 24 and 25 will pass into the apertures of the lock means during loading, and will be transported to the aperture leading to the inner space of the vacuum container. If each element is in contact with the vacuum space for ten seconds, a relatively quick interchange of elements and a corresponding quick movement of the slide valve will take place, whereby relatively large amounts of air is introduced into the lock means. A large portion of this air may be removed by evacuating the apertures in the slide valve during the working of the apparatus, but even if the lock means have been manufactured with the utmost accuracy, small spaces between the surfaces of the slide valve and the stationary surfaces will exist through which air may leak from the aperture connected with the outer atmosphere to the aperture connected with the vacuum space in the container.

SUMMARY OF THE INVENTION

The object of the invention is to provide an apparatus of the type in question which is so built that the said undesired air may be removed before it can reach the aperture connected with the vacuum space in the container.

According to the invention, cavities are so arranged in the apparatus that air, introduced through the aperture connected with the outer atmosphere and leaking between the surfaces of the slide valve and the surfaces of the stationary walls, is prevented from reaching the aperture connected with the inner space of the container without passing one of the said cavities, the cavities being connected to a vacuum source.

By this construction, air from the aperture connected with the outer atmosphere and carried in a valve aperture, as well as air passing between the surfaces in the lock means will sooner or later reach the said evacuated cavities and be evacuated from these.

Another object of the invention is to provide an apparatus of the said kind in which two or more sets of cavities are provided, each of which is connected with a separate vacuum source, the said cavities surrounding each other in such a way that air passing toward the aperture connected with the inner space of the container has to pass the sets of cavities in succession.

Still another object of the invention is to provide an apparatus of the said kind in which the cavities comprise grooves in the parallel, stationary walls.

A further object of the invention is to provide an apparatus of the said kind in which one set of cavities comprises an annular groove in each of the parallel, stationary surfaces surrounding the aperture connected with the inner space of the vacuum container.

A still further object of the invention is to provide an apparatus of the said kind in which a cavity is provided along the periphery of the slide valve and connected with a groove extending across the area inside the said cavity, the cavity and the groove being connected with a vacuum source, the aperture connected with the inner space of the container being surrounded by an annular groove which is connected with another vacuum source.

Figure 2:
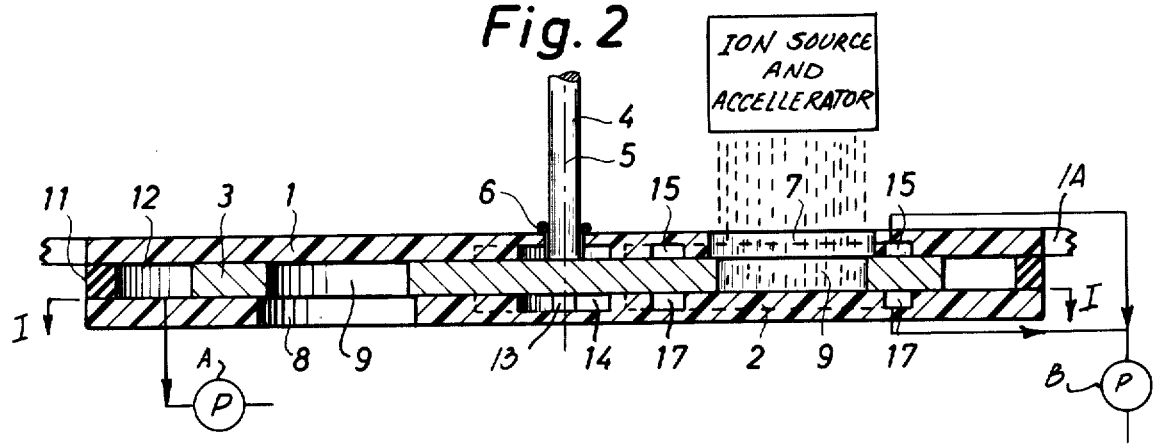

On the Drawings:

The invention is described below with reference to the accompanying drawing, in which FIG. 1 is a plan view of a stationary wall for a lock means according to the invention taken along line 1—1 of FIG. 2; and FIG. 2 is a cross-sectional view through the lock means taken along the line 11—11 in FIG. 1.

As Shown on the Drawings:

A lock means shown in FIG. 2 comprises two circular discs 1 and 2, preferably of plastic material, and a circular disc 3, e.g. a steel plate, mounted between the discs 1, 2 and rigidly connected to a shaft 4, so that it may rotate about the axis 5 of the latter. The disc 1 is an end wall of a high vacuum container 1A (shown fragmentarily in the drawing), and the shaft 4 is situated in the inner space of said container and is connected with drive means (not shown in the drawing) for rotation of the slide valve 3. A sealing ring 6 is mounted between the shaft 4 and the disc 1.

In the disc 1 a circular aperture 7 is provided, and this aperture is connected with the vacuum space in the said container 1A. In the disc 2 a corresponding circular aperture 8 is provided which is connected with the outer atmosphere line 15 at an angularly offset point, e.g. diametrically opposite.

The slide valve 3 has six circular apertures 9 whose location relative to the discs 1 and 2 are shown in FIG. 1 in dot-and-dash lines. The location of the aperture 7 in the disc 1 is shown in line segments. All the apertures are arranged on a circle 10, the center of which is concentric with the pivotal axis 5 of the slide valve 3.

A sealing ring 11 is arranged between the peripheral rim portions of the discs 1 and 2, so that an annular cavity 12 is provided between the sealing ring 11 and the periphery of the slide valve 3, which cavity 12 by means of a pair of radial grooves 13 in each of the discs 1 and 2 is connected to a central cavity 14 which is constituted by two recesses in the discs 1 and 2 and which is connected with the bore for the shaft 4.

The portion of the annular cavity 12 bounded by the ring 11 and the slide valve 3 is indicated by the larger dot-dash circles.

A groove 15 surrounds the aperture 7 in the disc 1, and a corresponding groove 17 is provided in the disc 2, said grooves having radial portions 16.

The system of passages which is constituted by the cavity 12, the grooves 13, and the cavity 14 is connected with a first vacuum pump a, and the passages 15 and 17 are connected with a second vacuum pump b.

During the use of the apparatus, circular element, such as a disc of semi-conducting material, is placed in each of the apertures 9 in the slide valve 3, and for each 60° of rotation of the slide valve, a finished element is returned to and removed through the aperture 8, and a new element is introduced through such aperture. At the following positioning of the slide valve, a new element is conveyed to the aperture 7 and is the exposed to ion treatment in the vacuum space of the container.

As shown in FIG. 1, the aperture 7 which is connected with the inner space of the vacuum container is surrounded by two sets of cavities of which the first set is constituted by the grooves 15-17 in each of the stationary surfaces, whereas the second set of cavities is constituted by the peripheral cavity 12, the grooves 13, and the cavity 14. Air leaking from the aperture 8 in a direction toward the aperture 7 in the spaces between the parallel surfaces of the slide valve and the stationary surfaces of the discs 1 and 2 will sooner or later reach the cavity 12 or the grooves 13 and will be evacuated by means of the vacuum pump a connected to this cavity system. Any air passing the said system of cavities will sooner or later reach one of the grooves 15-17 and will be evacuated by the vacuum pump B connected to these grooves.

The apertures 9, by the rotation of the slide valve 3 from the aperture 8 to the aperture will initially pause at and pass one of the grooves 13 and later on pause at and pass one of the grooves 16, and the apertures will therefore be evacuated on their way to the aperture 7 for either direction of incremental valve rotation.

By the structure which is described above, vacuum conditions are maintained in all the cavities in the lock means so that the necessary vacuum can be maintained in the vacuum container.

We claim:

1. Apparatus for ion-implantation in elements such as discs of semi-conducting material, comprising:
    a. a high vacuum container;
    b. an ion source and ion acceleration means disposed in said container;
    c. a first disc forming a wall of said container and a second disc secured in spaced relation thereto, said discs having stationary plane parallel walls facing each other, said first disc having a first aperture leading to the interior of said container and said second disc having a second aperture leading to the atmosphere;
    d. a slide valve having parallel surfaces slidably abutting said parallel walls, said slide valve having at least one throughgoing aperture for receiving an element through said second aperture, and for moving it into registration with said first aperture and back; and
    e. evacuated cavities in said discs and disposed to intercept the air introduced through said second aperture and leaking along said parallel valve surfaces, whereby air is prevented from reaching said first aperture.

2. Apparatus according to claim 1 having at least two sets of said evacuated cavities, each of which sets is adapted to be connected with a separate vacuum source, one set of said cavities surrounding the other set in such a way that any air leaking toward said aperture has to pass through both sets of cavities in succession.

3. Apparatus according to claim 1, said cavities comprising grooves in the parallel stationary walls of said discs.

4. Apparatus according to claim 3, said cavities comprising an annular groove in each of said walls and surrounding said first aperture.

5. Apparatus according to claim 1, said slide valve being a circular disc rotatable about its axis, said aperture or apertures in said slide valve being disposed on a circle concentric with said axis, said first and second apertures being disposed in substantially diametrically opposite relationship, one of said cavities having a portion extending along the periphery of said slide valve and including a connecting groove spanning said slide valve, and the other of said cavities being annular surrounding said first aperture.

* * * * *